United States Patent [19]

Mitsuhata

[11] 3,763,405

[45] Oct. 2, 1973

[54] SOLID STATE LUMINESCENT DISPLAY DEVICE

[75] Inventor: Teruhisa Mitsuhata, Tokyo, Japan

[73] Assignee: Nippon Electric Company, Limited, Tokyo, Japan

[22] Filed: Dec. 21, 1971

[21] Appl. No.: 210,433

[30] Foreign Application Priority Data

Dec. 21, 1970 Japan .............................. 45/116286

[52] U.S. Cl....... 317/235 R, 317/235 N, 313/108 D, 250/83.3 H

[51] Int. Cl. .............................................. H05b 33/00

[58] Field of Search .................. 317/235 N, 235 AJ, 317/235 AK; 250/83.3 H

[56] References Cited

UNITED STATES PATENTS

| | | | |
|---|---|---|---|
| 3,529,200 | 9/1970 | Potter | 313/108 |
| 3,548,193 | 12/1970 | Wendland | 250/83.3 |
| 3,595,991 | 7/1971 | Diller | 178/5.4 EL |

OTHER PUBLICATIONS

Electronics, May 11, 1970

McDermott et al., I.B.M. Tech. Discl. Bull., Vol. 12, No. 6, Nov. 1969

*Primary Examiner*—Martin H. Edlow

*Attorney*—Ostrolenk, Faber, Gerb & Soffen

[57] ABSTRACT

A solid state luminescent display device comprising a GaAs substrate, a plurality of p-n junctions formed on one surface of the substrate in a predetermined pattern, an infrared-to-visible light converting fluorescent substance mounted on a luminescent region provided at each p-n junction, a plurality of recesses formed on the other surface of the substrate and arranged to correspondingly be aligned with respect to p-n junctions and infrared-to-visible light converting fluorescent substance provided in each recess to enable the device to simultaneously and selectively generate visible light at selective surfaces of the substrate, in accordance with those p-n junctions which are activated.

6 Claims, 6 Drawing Figures

SOLID STATE LUMINESCENT DISPLAY DEVICE

BACKGROUND OF THE INVENTION

The present invention relates to solid state luminescent display devices which can simultaneously provide both an observable luminescent display and the generation of hard copy identical to the observable display, and more particularly, to improvements in the matrix type of solid state luminescent display devices and segment type of solid state luminescent digit display devices which comprise p-n junctions in GaAs doped with Si and infrared-to-visible light converting fluorescent substance in combination.

It has been known that infrared-to-visible converting fluorescent compositions such as $$Y_{0.74}\,Yb_{0.25}\,Er_{0.01}\,OCl,$$

$$Y_{0.84}\,Yb_{0.15}\,Er_{0.01}\,F_3,\text{ and}$$

$$Y_{0.65}\,Yb_{0.35}\,Tm_{0.001}\,F_3$$

or the like, can convert near infrared rays emitted from a Si-doped GaAs light-emitting diode having a power efficiency of a few percent to a few tenths of a percent, into visible rays such as red, green or blue rays at a high efficiency. By making use of these phenomena, a solid state luminescent display device having a practical luminescent brightness of 20fL or higher has been manufactured.

A conventional matrix type of solid state luminescent display device existing in the prior art may comprise a structure such as that shown in FIG. 1, and having an $n^+$-type GaAs substrate 12 having an ohmic metal electrode 11 of Au-Ge alloy provided on its back surface. An n-type GaAs 13 and p-type GaAs 14 are both grown on substrate 12 through a liquid phase epitaxial crystal growth process to form p-n junctions 17. Zn is diffused from the surface of each p-type GaAs 14 to form a $p^+$-type GaAs 15 having a thickness of $2\mu m$ thereon, on a part of the surface of each $p^+$-type GaAs 15 is provided an ohmic metal electrode 16 to which a thin gold wire 10 of $25\mu m$ in diameter is bonded to form an electrical connection for coupling with peripheral devices (not shown) and further on the surface of each $p^+$-type GaAs 15 is provided an infrared-to-visible light converting fluorescent substance 18. A plurality of such p-n junctions have fluorescent substances (three being shown in FIG. 1) are provided and are arranged in a regular matrix pattern.

A preferred alpha-numeric display device had also been mentioned in the literature "Electronics," May 11, 1970, page 89, article entitled with "Seeing Red, Yellow and Green in a Semi-conductor Alpha-numeric Display" by A. M. Barnet and F. K. Heumann.

In cases where hard copying is to be performed by means of the matrix type of solid state luminescent display device having the structure as shown in FIG. 1 or as mentioned above literature to create a permanent record of the illuminated display, there were disadvantages in handling and in economy such that either an additional display apparatus solely for use in a hard copying or a photography operation, which comprises another solid state luminescent display device and a hard copying or a photographing device, was required, or a photographing device must be mounted in front of the solid state luminescent display device to photograph the displayed picture, thereby obscuring the display device and preventing simultaneous visual observation of the display.

OBJECTS AND SUMMARY OF THE INVENTION

An object of the present invention is to provide a solid state luminescent display device comprising an integrated form of p-n junctions in GaAs doped with Si and infrared-to-visible light converting fluorescent substance in combination, by use of which both viewing and hard-copy production of the displayed picture can be simultaneously performed without use of any apparatus except hard copy or camera device, thereby avoiding the need for an additional display device.

Another object of the present invention is to provide solid state luminescent displays of the matrix type and segment type for attaining above object.

Still another object of the present invention is to provide a solid state luminescent display device which achieves the above-mentioned objects with simplicity in the structure and manufacturing techniques, and at a low cost.

Another object of the present invention is to provide a solid state luminescent device which selectively creates identical illuminated displays at both surfaces of the substrate simultaneously.

According to the present invention, a solid state luminescent display device comprises a GaAs substrate, a plurality of p-n junctions formed and arranged in a predetermined regular pattern on one surface of the substrate, infrared-to-visible light converting fluorescent substance mounted on each of the p-n junctions, recesses formed on the opposite surface of the substrate correspondingly to respective p-n junctions, infrared-to-visible light converting fluorescent substance mounted in each of the recesses, and electrode means for providing electric voltage and current to each of p-n junctions.

Further objects and features of this invention will become apparent from the following description of embodiments of the present invention making reference to the annexed drawings.

DETAILED DESCRIPTION OF THE PREFERRED EMBODIMENTS

Figure 1:
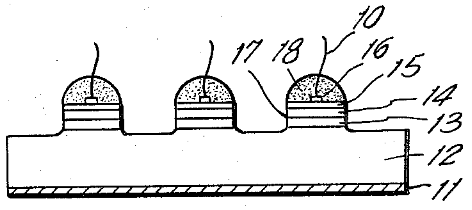
FIG. 1 is a cross-sectional view of a matrix type of solid state luminescent display device of the prior art.
Figure 2:
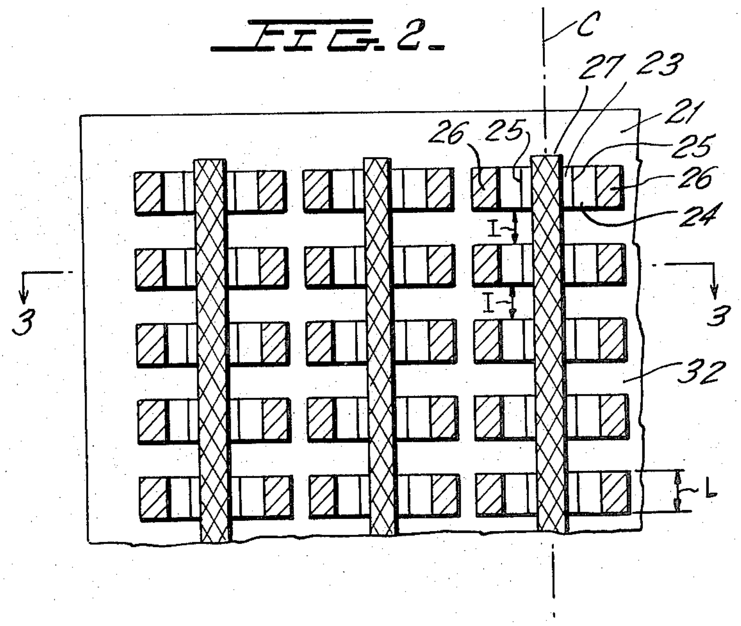
FIGS. 2 and 3 are top and cross-sectional views, respectively, of an embodiment of a matrix type of solid state luminescent display device according to the present invention, by which the viewing and hard copy generation of the luminescent display can be performed simultaneously.
Figure 3:
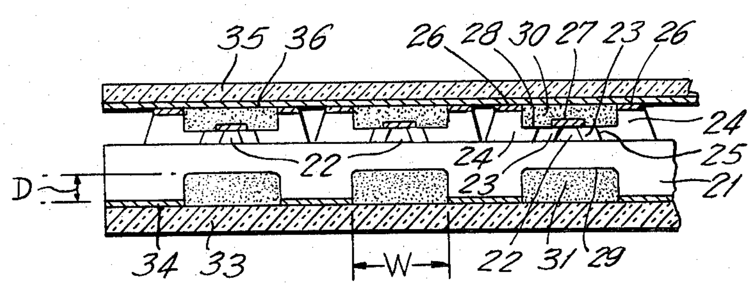

FIGS. 2 and 3 show one preferred embodiment of the matrix type of solid state luminescent display device according to the present invention, FIG. 2 being a top view thereof, and FIG. 3 being a cross-sectional view taken along line 3—3 in FIG. 2.

Referring to FIGS. 2 and 3, the solid state luminescent display device has a semi-insulating GaAs substrate 21, on one surface of which substrate a plurality of band-shaped mesas (three mesas 22 are shown in FIG. 3 for purposes of simplicity) are provided and are arranged in parallel to one another. On the surface of the substrate 21 a plurality of pairs of n-type GaAs regions, one pair of which is represented by the reference number 23, are provided in contacting engagement with each of both aligned side surfaces of each mesa 22 and equally spaced relative to each other along the band-shaped mesa 22. At the side of each of n-type GaAs regions 23 is provided a p-type GaAs region 24 so that a p-n junction 25 is formed in parallel to each side surface of the mesa 22.

It should be noted that the n-type GaAs regions 23 formed on one side surface of one mesa 22 correspond to an n-type GaAs region formed on the other side surface of the same mesa 22. The upper surfaces of the mesa 22, and two n-type GaAs regions 23 at both sides of the mesa and two p-type GaAs regions 24 junctioned with respective n-type GaAs regions 23 are formed so as to define a depression 28. On the bottom of the depression 28 and over the surfaces of the mesa 22 and two n-type GaAs regions 23 is provided an ohmic metal electrode 27. It should be noted that this metal electrode 27 is band-shaped and elongated along the band-shaped mesa to serve as a common electrode for a plurality of pairs of two n-type GaAs regions which are formed along the mesa 22 and equally spaced relative to one another. On the surfaces of the respective p-type GaAs regions 24 are provided ohmic metal electrodes 26. On the bottom surface of the substrate 21, a recess 29 is formed so as to be in registry with the depression 28. The depressions 28 and recesses 29 are filled with an infrared-to-visible light converting fluorescent substance, 30 and 31 respectively.

From the above description in connection with FIGS. 2 and 3, it should be understood that the fluorescent substance is arranged in a matrix form on respective surfaces of the substrate. When a suitable electric voltage and current is applied between a band-shaped electrode 27 and a pair of electrodes 26 along the band-shaped electrode 27, the fluorescent substance in the depression 28 corresponding to the energized pair of electrodes 26 and in the recess 29 in register with the depression 28, illuminate. It should further be understood that any arbitrary pattern, such as alpha-numeric characters or other symbols, can be displayed by illumination by the application of suitable voltage and current to appropriate band-shaped electrodes 27 and appropriate pairs of electrodes 26. It should be noted that the luminous display is produced at both surfaces of the substrate.

In order to make the Si-doped GaAs grow on the semi-insulating GaAs crystal substrate 21 to form p-n junctions 25, a liquid phase epitaxial crystal growth technique based on the following principle, is employed.

In general, it has been known that the rate of crystal growth differs depending upon the orientation of the crystal face. The present inventor discovered the fact that if two or more crystal faces having different rates of crystal growth, respectively, are simultaneously exposed on a surface of a plannar substrate crystal, there exists a critical value of the surface area of the crystal face having the lowest rate of crystal growth with respect to the crystal growth in the orientation of the crystal face, although the critical value depends upon the shape of the exposed face, and that by limiting the surface area of the crystal face having the lowest rate of crystal growth to within the critical value and then carrying out the crystal growth, the crystal face or faces having a higher rate of crystal growth could be selectively grown without any substantially considerable crystal growth in the orientation of the crystal face having the lowest rate of crystal growth. This selective crystal growth may be very sensitively affected by the off-orientation of the crystal face having the lowest rate of crystal growth. (See Japanese Patent Application No. 59154/69) Here, the term "critical value" implies a boundary value, above which the selective crystal growth can occur, but below which the selective crystal growth cannot occur. Hereinafter, a term "growth critical value" is used in the above meaning. This critical value is determined mainly by the relationship between the crystal face having the lowest rate of crystal growth and the other crystal face or faces having a higher rate of crystal growth, in connection with the orientation of crystal faces, the mechanism of crystal growth, the shape of the crystal face, and the like. According to this method, it is possible to carry out the crystal growth selectively without necessitating a protective coating such as $SiO_2$ or the like. Now this basic principle will be explained with reference to exemplary crystal faces.

On a $(\bar{1}\ \bar{1}\ \bar{1})$ As crystal face is formed a band-shaped mesa with making 90° with respect to the (1 1 0) cleavage plane wherein the width of the band is smaller than the critical width, and a crystal face having a higher rate of crystal growth is exposed on the $(\bar{1}\ \bar{1}\ \bar{1})$ As crystal face, to use this crystal as a substrate. When a liquid phase epitaxial growth is carried out for this substrate having the band-shaped mesa, the crystal growth occurs selectively on the sides of the band-shaped mesa and never occurs with the thickness more than 0.3$\mu$m on the top surface of the mesa.

If a circular mesa having a diameter smaller than the critical value is formed on a substrate having a $(\bar{1}\ \bar{1}\ \bar{1})$ As crystal face, and if the liquid phase epitaxial growth is carried out for this substrate, then the crystal growth occurs selectively on the side surface of the mesa, and never occurs with the thickness more than 0.3$\mu$m on the top surface of the same.

Then, the surface in the $(\bar{1}\ \bar{1}\ \bar{1})$ As orientation of the grown layer on the side of the mesa and the top surface of the mesa aligns on the same plane.

The manufacturing method of the device shown in FIG. 3 is as follows:

Referring to FIG. 3, the band-shaped mesas 22, having a width of 100$\mu$m, 300$\mu$m in repetition interval, and 40$\mu$m in height, are formed through a photo-etching technique, with making 90° with respect to the (1 1 0) cleavage plane, and thereafter, a liquid phase epitaxial crystal growth is carried out. For instance, a mixture of high purity gallium 4.2g, GaAs 0.24g and Si 10mg is heated up to a temperature of 850°C within a hydrogen atmosphere to form a molten liquid, then this liquid is cooled at a rate of 1°C/min., and when the temperature of the molten liquid has reached 815°C, the substrate surface of the semi-insulating GaAs substrate 21, on which the band-shaped mesas 22 are provided, and said molten liquid are brought into contact, and the cooling operation is further continued until the temperature reaches 804°C, when the molten liquid is removed from the substrate surface. Then, on both sides of each of the band-shaped mesas 22 on said semi-insulating GaAs substrate 21, layers of n-type GaAs 23 have been grown by 40μm in width along the mesa and furthermore, the layer of p-type GaAs 24 has been grown by 160μm in width continuously to the n-type GaAs layer 23, whereby aligned, spaced parallel p-n junctions 25 are formed on the respective sides of each of the band-shaped mesas 22.

The data in the crystal growth mentioned above may be sensitively affected by the crystal growth condition, such as the temperature distribution and the fluctuation in the molten liquid, the slope of the boat used for the crystal growth, the mass of the silicon, the gallium and gallium arsenide, cooling rate and so on.

Subsequently, a cahnnel having a width of 140μm on each side from the center line C of the band-shaped mesa 22 and a depth of 30μm, is formed in each of the platforms, which channel is defined by a mesa 22, a pair of n-type GaAs layers 23 at both sides of the mesa and a pair of p-type GaAs layers 24 through a photo-etching process.

An Au-Ge alloy layer 27 is provided so as to make electrical contact with at least a part of the n-type GaAs crystal regions 23 to form an ohmic metal electrode, while on each p-type GaAs region 24 is provided an Au-Zn alloy layer to form an ohmic metal electrode 26.

Next, at each of the sides of the mesa 22, the n-type and p-type GaAs layers are partly removed every predetermined interval I (of 100μm) in the lengthwise direction of a mesa 22 through a photo-etching technique so that at each of the sides of a mesa 22, p-n junctions 25 of 100μm in length are arranged with 100μm intervals along the mesa. Accordingly, a matrix array of a great number of mesa p-n junctions 25 is formed, as shown in FIG. 2.

Then, on the back side of the semi-insulating GaAs substrate 21, are formed the recesses 29 of 100μm in length (L), 280μm in width (W), and 60μm in depth (D) through a photo-etching technique at a position directly opposite to and in alignment with the depressions 28.

In order to be able to achieve the electrical connections to the ohmic metal electrodes 26 and 27 with peripheral circuits simultaneously through a face-down bonding technique, the ohmic metal electrodes 26 and 27 of the p-n junctions located at the respective ends of each band-shaped mesa 22 in its lengthwise direction, are bonded to be connected to each other by means of a gold tape having a thickness of 50μm and a width of 100μm, and the p-n junctions located at the respective ends of each band-shaped mesa 22 in its lengthwise direction may be used as a bonding pad for the ohmic metal electrodes 27, and not used as a light-emission diode.

Infrared-to-visible light converting fluorescent substance 30 is deposited in all of the depressions 28 exposing the p-n junctions 25, except for those located at the respective ends of each band-shaped mesa 22 in its lengthwise direction, then electrical connections are made through a face-down bonding technique to a transparent insulating plate 35 which has a predetermined wiring pattern, and further which is provided with transparent electrodes 36 through which visible rays can transmit at the parts corresponding to the luminescent regions. An infrared-to-visible light converting fluorescent substance 31 is deposited in the recesses 29, and a transparent plate 33, such as, for example, glass, is adhered to the back surface of the semi-insulating GaAs substrate 21 with adhesives, to provide a solid state luminescent display device capable of emitting visible rays from its both surfaces, as shown best in FIG. 3. If a photosensitive film is placed on or adjacent the transparent plate 33 by the intermediary of a shutter, and if said photosensitive film is fed in synchronism with the opening and closing of the shutter, then one can obtain a solid state luminescent display device, which produces a hard copy of the illuminated display at an arbitrary moment while observing the luminescent display on the side of the transparent insulating plate 35. It is a matter of course that by providing a photopraphing device on the side of the transparent plate 33, also it is possible to take a photograph simultaneously with the observation of the luminescent display from the surface of transparent insulating plate 35.

If one kind of infrared-to-visible converting fluorescent substance is filled in each of the depressions 28 and recesses 29, monochromatic emission can be obtained, while if infrared-to-visible light converting fluorescent substances which emit visible rays of three primary colors of red, green and blue, respectively, are individually filled in predetermined different depressions 28 with a predetermined order, then natural color display can be obtained by controlling the voltage or current applied between electrodes 26 and 27. It is obvious that black-and-white, monochromatic, or natural-colored hard copies can be obtained according to types of fluorescent substances employed.

Figure 4:
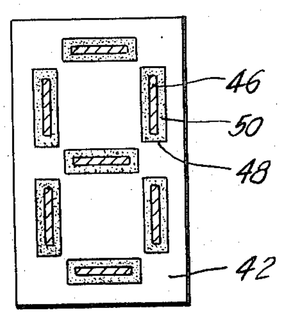
FIGS. 4 and 5 are top and cross-sectional views, respectively, of an embodiment of a segment type of luminescent digital display device, which has been formed by improving a part of the alpha-numeric display described in above literature, according to the teaching of the present invention.
Figure 5:
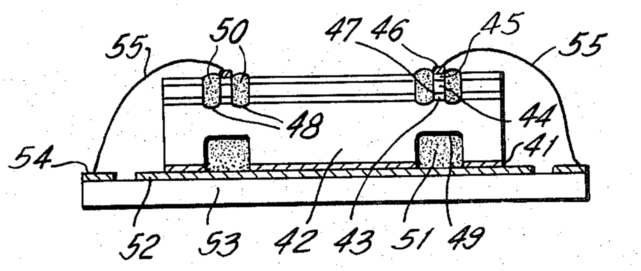

FIGS. 4 and 5 show one preferred embodiment of a segment type of solid state luminescent display device according to the present invention, FIG. 4 being a top view thereof, and FIG. 5 being a cross-sectional view.

On an $n^+$-type GaAs substrate 42 having a (1 0 0) crystal face and an electron density of the order of $10^{18}$ $cm^{-3}$, are grown n-type GaAs 43 of 20μm in thickness and p-type GaAs 44 of 60μm in thickness through a liquid phase epitaxial crystal growth technique to form a p-n junction 47.

A liquid phase epitaxial crystal growth is carried out as follows. For instance, a mixture of high purity gallium 6g, gallium arsenide 0.96g, and silicon 20mg is heated up to a temperature of 960°C with in a hydrogen atmosphere to form a molten liquid, then this liquid is cooled at a rate of 1°C/min., and when the temperature of the molten liquid has reached 910°C, the surface of the $n^+$-type GaAs substrate and the molten liquid are brought into contact with each other, and the cooling operation is further continued until the temperature reached 700°C, when the molten liquid is removed from the substrate surface. The similar crystal growth process is used to form a matrix type of solid state luminescent display device shown in FIG. 6.

In order to reduce the contact resistance for the p-type GaAs 44, Zn is diffused into the p-type GaAs 44 from its surface to form $p^+$-type GaAs 45 of 2μm in thickness, on which an ohmic metal electrode 46 is formed by means of Au-Zn alloy, while for the $n^+$-type GaAs 42 an ohmic metal electrode 41 is formed by means of Au-Ge alloy.

Through an etching technique, segments of 100$\mu$m in width and 1mm in length are formed to show an array of p-n junctions in the form of a decimal "8" digit consisting of 7 segments, as shown best in FIG. 4, and around the respective segments are provided channels 48 of 200$\mu$m in width and 75$\mu$m in depth.

Subsequently, on the opposite surface of the $n^+$-type GaAs, are formed through a photo-etching technique recesses 49 of 500$\mu$m in width, 1.4mm in length and 60$\mu$m in depth, which are arrayed in the form of the decimal digit "8," consisting of 7 segments at the positions opposite to and in alignment with the first-mentioned respective segments. The channels 48 and the recesses 49 are filled with an infrared-to-visible light converting fluorescent substance 50 and 51.

A transparent insulating plate 53 such as glass, for example, is coated with a transparent conductor 52 and is adhered to the ohmic metal electrode 41 with conductive adhesives such as silver paste, and electrical connections are made between the ohmic metal electrodes 46 and bonding pads 54 provided on the transparent insulating substrate 53 by bonding thin gold wires 55 therebetween. Then a matrix type of solid state luminescent display device as shown in FIG. 5 can be obtained.

If a photosensitive film is placed on or near the transparent insulating plate 53 by the intermediary of a shutter, and if said photosensitive film is fed in synchronism with the opening and closing of the shutter, then one can obtain a solid state luminescent display device, which enables the simultaneous production of a hard copy while observing the luminescent display on the side of the p-n junctions. It is a matter of course that by providing a photographing device on the side of the transparent insulating plate 53, it is also possible to photograph the luminescent display while observing the same from the side of the p-n junctions.

If one kind of infrared-to-visible light converting fluorescent substance is filled in each of the channels 48 and recesses 49, monochromatic emission can be obtained, while if infrared-to-visible light converting fluorescent substances which emit visible rays of the three primary colors of red, green and blue, respectively, are filled with approximate mixing rate, then light emission of a desired color can be obtained by applying the voltage or current between electrodes 41 and 46. It is obvious that black-and-white, monochromatic, or desired colored hard copies can be obtained according to the types of fluorescent substances which are employed.

Figure 6:
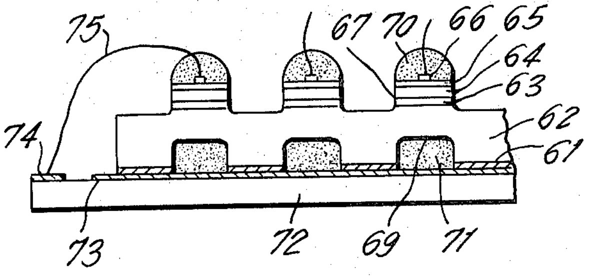
FIG. 6 shows a cross-sectional view of another embodiment of a matrix type of solid state luminescent display device which has been formed by improving a part of the prior art matrix type of solid state luminescent display device according to the teaching of the present invention.

FIG. 6 shows another preferred embodiment of a matrix type of solid state luminescent display device which can perform both the luminescent display and the hard copying simultaneously according to the present invention.

On an $n^+$-type GaAs crystal substrate 62 having a (1 0 0) crystal face and an electron density of the order of $10^{18}cm^{-3}$, are grown n-type GaAs 63 of 20$\mu$m in thickness, and p-type GaAs 64 of 60$\mu$m in thickness through a liquid phase epitaxial crystal growth technique to form a p-n junction 67. In order to reduce the contact resistance for the p-type GaAs 64, Zn is diffused into the p-type GaAs 64 from its surface to form $p^+$-type GaAs 65 of 2$\mu$m in thickness, on which an ohmic metal electrode 66 is formed by means of Au-Zn alloy, while for the $n^+$-type GaAs 62, an ohmic metal electrode 61 is formed by means of Au-Ge alloy.

Through a photo-etching technique, a matrix array of p-n junctions having a junction area of 300$\mu$m square, a height of 75$\mu$m and a separation between centers of 500$\mu$m, is formed. Subsequently, on the $n^+$-type GaAs crystal substrate 62 is formed a matrix array of recesses 69 having an area of 300$\mu$m × 300$\mu$m and a depth of 60$\mu$m at the positions oposite to and in registry with the matrix array of p-n junctions.

The recesses 69 are filled with infrared-to-visible light converging fluorescent substance 71, and a transparent insulating plate 72, as of glass, provided with a transparent conductive coating 73 is adhered to an ohmic metal electrode 61 to make electrical connections.

Electrical connections are made between bonding pads 74 provided on the transparent insulating plate 72 and the ohmic metal electrodes 66 by bonding thin gold wires 75 therebetween, and on the $p^+$-type GaAs 65 of each p-n junction is applied an infrared-to-visible light converting fluorescent substance 70. Then a matrix type of solid state luminescent display device, as shown in FIG. 6, can be obtained.

If a photosensitive film is placed on or near the transparent plate 72 which may be glass, for example, and an intervening shutter is provided, and if said photosensitive film is fed in synchronism with the opening and closing of the shutter, then one can obtain a solid state luminescent display device, which enables the generation of a hard copy at an arbitrary moment while observing the luminescent display on the side of the p-n junctions. It is a matter of course that by providing a photographing device on the side of the transparent plate 72, it is also possible to photograph the luminescent picture while observing the luminescent display on the side of the display opposite transparent plate 72.

If one kind of infrared-to-visible light converting fluorescent substance is filled in each of the recesses 69, and applied on each of the $p^+$-type GaAs 65, monochromatic emission can be obtained, while if infrared-to-visible light converting fluorescent substances which emit visible rays of the three primary colors of red, green and blue, respectively, are individually filled in predetermined different depressions 28 with a predetermined order and applied, then natural color display can be obtained by controlling the voltage or the current applied between electrodes 61 and 66. It is obvious that black-and-white, monochromatic or natural colored hard copies can be obtained according to the types of fluorescent substances used.

While the invention has been described above in connection with a matrix type of solid state luminescent display device in which the p-n junctions and the infrared-to-visible light converting fluorescent substances are separately positioned on its front and back surfaces, respectively, it is apparent that the area and shape of the p-n junctions, the interval between the p-n junctions, the method for arraying the p-n junctions, and the area, depth, shape and array of the recesses to be filled with the infrared-to-visible light converting fluorescent substances are not limited to the above-described and illustrated embodiments, but only by the appended claims.

What is claimed is:

1. A solid state luminescent display device comprising:

a substantially flat GaAs crystal substrate having a plurality of upwardly extending projections arranged in a speced predetermined array on one surface of said substrate, said projections each forming a mesa having a substantially flat upper surface and at least one inclined side surface;

an n-type semiconductor material being deposited on the side wall of each mesa;

a p-type semiconductor material being deposited upon each of said n-type materials forming a p-n junction therebetween wherein said p-n junction is aligned substantially parallel to the aforesaid mesa side wall;

an electrical terminal being provided on one surface of each of said n-type and p-type materials, said terminals each being spaced from their associated p-n junctions;

a fluorescent material being deposited upon each of said p-n junctions;

the opposite surface of said substrate having a plurality of cavities, each cavity being aligned with an associated one of said mesa provided on said one surface;

a fluorescent material being deposited in each of said cavities;

means selectively coupled to the terminals of the p-n junctions for selectively electrically energizing said p-n junctions to cause the fluorescent material deposited on the energized p-n junctions and the fluorescent material in the cavity aligned with the energized p-n junction to emit rays in the visible light range, and thereby simultaneously activate the fluorescent materials on both sides of said substrate which are associated with said energized p-n junctions;

said n and p-type materials being respectively comprised of n-type and p-type GaAs performing the p-n junctions;

light transparent conductive means being deposited upon and overlying said light converting substance for providing electrical connections between said electrical contacts and said selective energizing means while enabling the rays emitted from said fluorescent materials deposited on said p-n junctions to be transmitted therethrough.

2. The device of claim 1 wherein the width of each of said mesas is less than a predetermined amount to prevent the growth of said n-type material of said p-n junction from being grown upon the top surface of said mesa.

3. The device of claim 1 further comprising a light transparent insulating surface provided upon said light transparent conductive means.

4. The device of claim 1 further comprising contact means provided on said opposite surface of said substrate.

5. The device of claim 4 further comprising a light transparent insulating surface provided upon the contact means deposited upon said opposite surface and overlying said light converting substance.

6. The device of claim 1 wherein the fluorescent materials deposited on said p-n junctions each form elongated segments separated from one another and arranged so as to collectively form a decimal "8."

* * * * *